(12) United States Patent
Liu (10) Patent No.: US 7,283,345 B2
(45) Date of Patent: Oct. 16, 2007

(54) PCB TRACE COUPLING SYSTEM FOR PROVIDING HIGH VOLTAGE ISOLATION

(76) Inventor: Gang Liu, 1097 Borregas Ave., Sunnyvale, CA (US) 94089

( * ) Notice: Subject to any disclaimer, the term of this patent is extended or adjusted under 35 U.S.C. 154(b) by 562 days.

(21) Appl. No.: 10/891,713

(22) Filed: Jul. 14, 2004

(65) Prior Publication Data

US 2005/0036247 A1 Feb. 17, 2005

Related U.S. Application Data

(60) Provisional application No. 60/487,361, filed on Jul. 14, 2003.

(51) Int. Cl.
*H02H 9/00* (2006.01)

(52) U.S. Cl. .............................. 361/118; 361/35
(58) Field of Classification Search ............... 361/118, 361/35

See application file for complete search history.

(56) References Cited

U.S. PATENT DOCUMENTS 5,003,622 A * 3/1991 Ma et al. .................. 455/327

* cited by examiner

*Primary Examiner*—Stephen W. Jackson
(74) *Attorney, Agent, or Firm*—James Cai; Schein & Cai LLP (57) ABSTRACT

A printed circuit board trace coupling system for providing high voltage isolation includes a driving circuit, a coupling transformer including a printed circuit board trace, and a receiving circuit.

7 Claims, 10 Drawing Sheets

PCB TRACE COUPLING SYSTEM FOR PROVIDING HIGH VOLTAGE ISOLATION

CROSS REFERENCE TO RELATED APPLICATIONS

The present application claims priority under 35 U.S.C. 119(e) from provisional patent application Ser. No. 60/487,361, entitled "PCB Trace Coupling System for Providing High Voltage and/or High Slew Rate Isolation", filed on Jul. 14, 2003, the disclosure of which is herein incorporated by reference in its entirety.

BACKGROUND OF THE INVENTION

The present invention relates to the field of signal coupling, receiving, and driving techniques, and more particularly to transmitting timing, triggering, front-stage-driving, and last stage driving signals used for driving MOSFETs (Metal Oxide Silicon Field Effect Transistor) where high voltage isolation between the signal source and the MOSFETs is needed.

Conventional devices used for coupling signals in high voltage isolation applications include optical couplers and transformers. An optical coupler includes a light emitter and receiver. The former converts electric signals into light signals and the latter converts the light signals back to electric signals. In this manner the coupling function is completed.

A transformer device converts an electric signal into a magnetic signal by sending a voltage to a first coil winding, conventionally called the primary winding. The magnetic field is then picked up by a second coil winding, conventionally called the secondary winding, and converted back into an electric signal, which is similar to the original signal sent to the primary winding.

The optical coupler can provide high voltage isolation because the light can travel across a free space, such as air, or an optically transparent but electrically isolative material, such as clear plastic and glass. However the optical coupler can only couple signals having a low power level, such as a few milliwatts. When high power signal coupling is needed, the optical coupler becomes very expensive and high cost lasers have to be used as the emitter and high cost large area photo-detectors have to be used as the receiver for sending and receiving the high power signals respectively.

The transformer device can provide high power coupling, or high power transmission, with high voltage isolation capability. However both the cost and size of the transformer device increase dramatically as the power increases. Furthermore, when low frequency signals need to be coupled, or transmitted, the transformer device size increases compared with that required for transmitting a same power signal having a higher frequency. Keeping the size of the transformer device constant, the level of power that can be transmitted is lower for signals of low frequencies and the efficiency lower.

There is therefore a need in the art for a low cost high voltage isolation device capable of transmitting pulse signals having a wide range of pulse widths with a short time delay and precise timing.

SUMMARY OF THE INVENTION

In accordance with one aspect of the invention, a printed circuit board trace coupling system for providing high voltage isolation includes a driving circuit, a coupling transformer including a printed circuit board trace, the printed circuit board trace comprising a closed loop primary winding surrounding a closed loop secondary winding formed on a same surface of the printed circuit board, the closed loop secondary winding being coupled to leads formed on another side of the printed circuit board, and a receiving circuit.

These and other features, aspects and advantages of the present invention will become better understood with reference to the following drawings, description and claims.

DETAILED DESCRIPTION OF THE INVENTION

Figure 1:
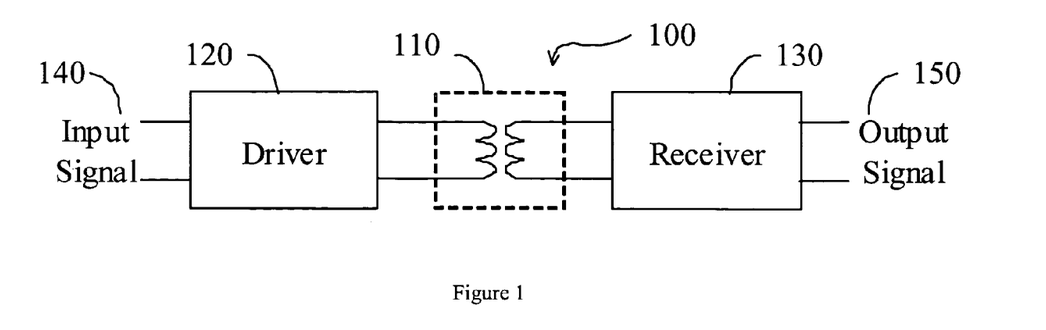
FIG. 1 is a block diagram of a PCB trace coupling system in accordance with the present invention.

A printed circuit board trace coupling system for providing high voltage isolation generally designated 100 is shown in FIG. 1. The coupling system 100 advantageously utilizes a relatively small portion of the printed circuit board to implement a coupling transformer 110 coupled between a driver circuit 120 and a receiver circuit 130. Driver circuit 120 may be operable to receive an input signal 140 and receiver circuit 130 may be operable to output an output signal 150.

Figure 4:
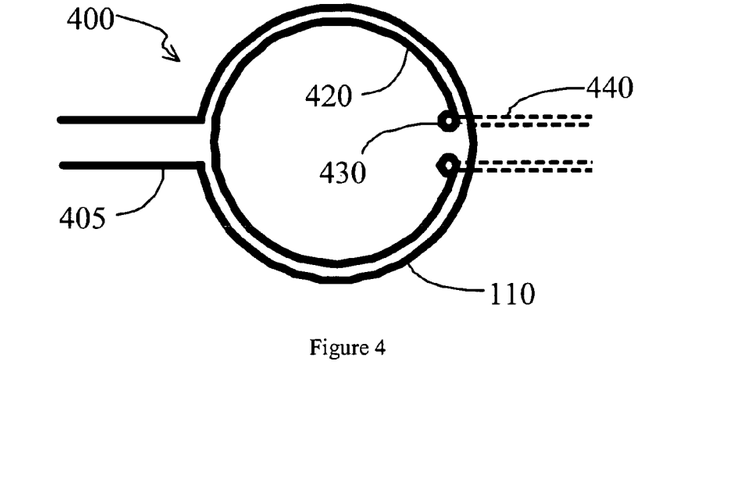
FIG. 4 shows a single turn PCB trace coupler which can be used for the circuit shown in FIG. 2 in accordance with the present invention.

FIG. 4 shows a simple implementation of the coupling transformer 110 embodied in a PCB trace. A coupling transformer generally designated 400 utilizes one side of the PCB to form a primary winding 405 and a secondary winding 420. Vias 430 may be formed to connect the secondary winding 420 to leads 440 formed on another side of the PCB. As shown primary winding 405 includes only one turn as does secondary winding 420. The coupling transformer 400 takes up a small PCB area, has a high response speed, and has a small self induction of each winding 405 and 420. As a result, only narrow pulse signals may be transmitted through coupling transformer 400.

In operation the driver circuit 120 (FIG. 1) may send an electric energy signal into the primary winding 405 which may convert the electric energy signal from the driver circuit 120 into a magnetic energy signal. The secondary winding 420 may convert the magnetic energy signal back into an electric energy signal and send this signal to the receiver circuit 130. The receiver circuit 130 may receive and amplify the electric energy signal from the secondary winding 420 and convert it into a signal which can be used by a next component which, depending upon the application, may be a MOSFET or another type of component.

Figure 2:
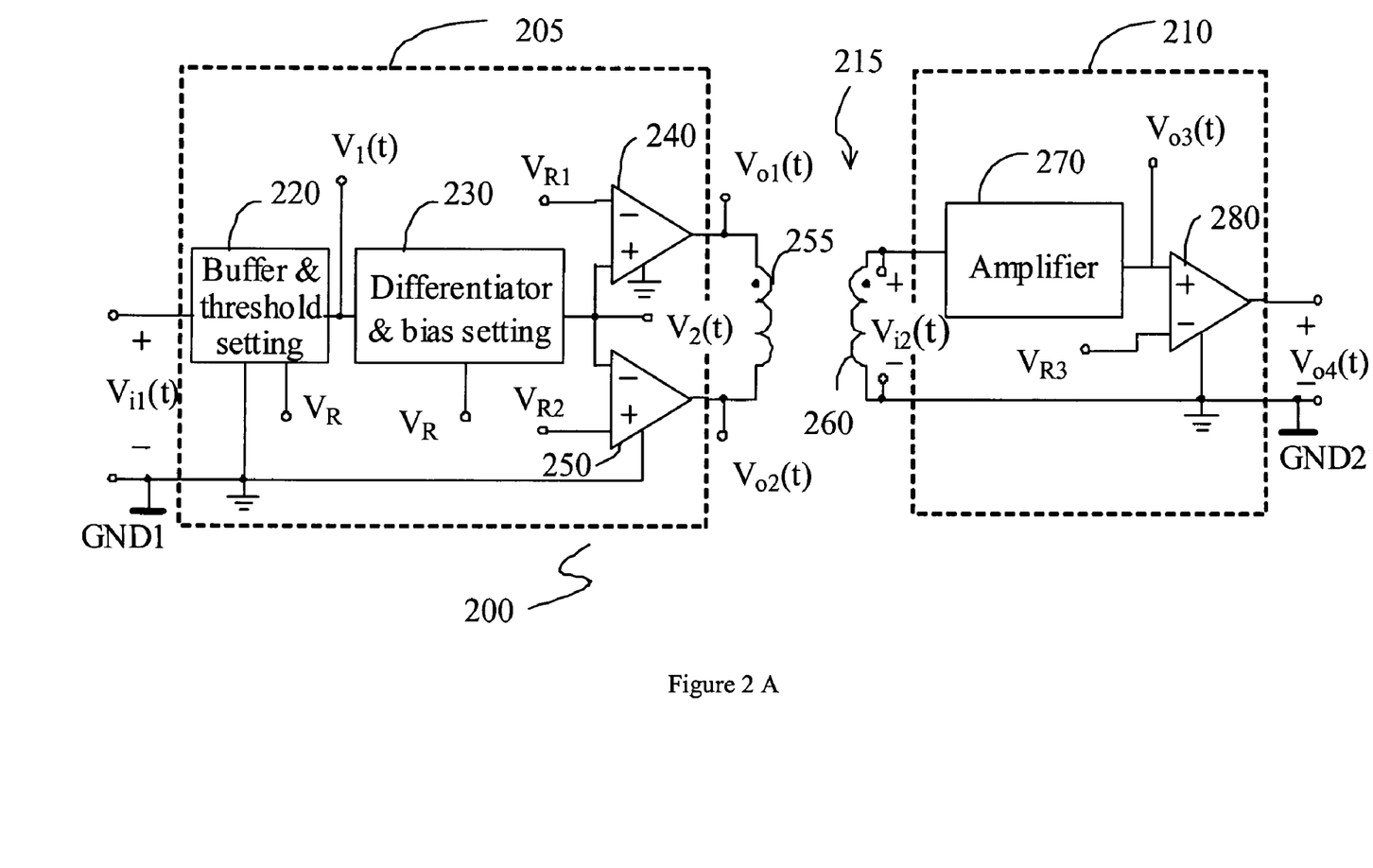
FIG. 2A shows a simplified embodiment of the PCB trace coupling system in accordance with the present invention.
FIG. 2B shows an alternative embodiment of the PCB trace coupling system in accordance with the present invention.
Figure 3:
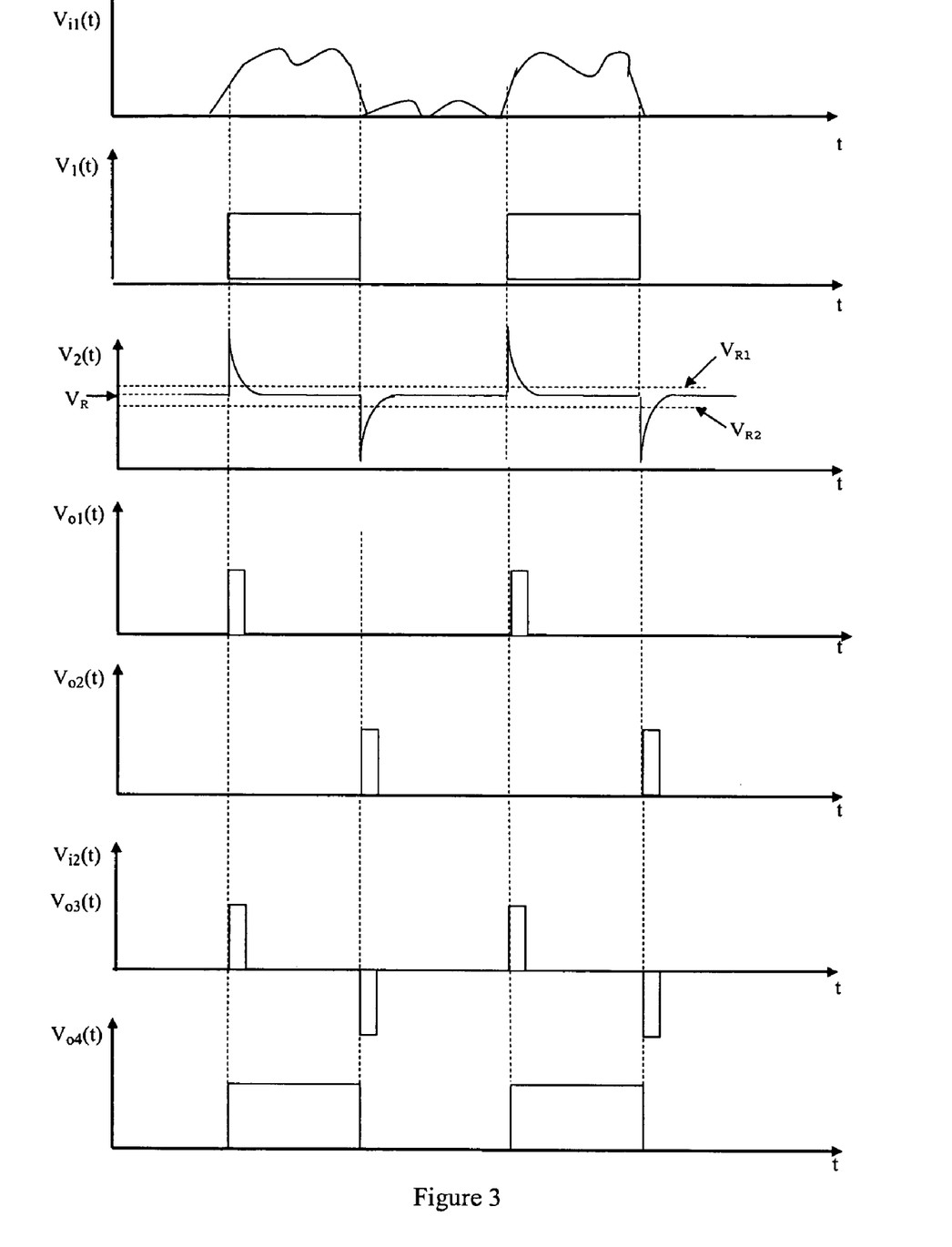
FIG. 3 shows the voltage waveforms of the system shown in both FIG. 1 and FIG. 2 in accordance with the present invention.

In one aspect of the invention, the coupling system 100 may be implemented in a coupling system generally designated 200 shown in FIG. 2A. A driver circuit 205 may be coupled to a receiver circuit 210 through a coupling transformer generally designated 215. An input signal $V_{i1}(t)$ may be input to a buffer circuit 220, resulting in a signal $V_1(t)$, which has a consistent slew rate and amplitude as shown in FIG. 3. Thus even as the input voltage $V_{i1}(t)$ changes its amplitude and/or slew rate, the output from a differentiator 230, V2(t), will not change due to the action of the buffer 220. Comparators 240 and 250 may have reference voltages set to $V_{R1}$ and $V_{R2}$ respectively. By setting $V_{R1}$ and $V_{R2}$ properly, the comparator output voltages $V_{o1}(t)$ and $V_{o2}(t)$, may be pulses with proper width and timing as shown in FIG. 3. The coupling transformer 215 may have two windings, a primary winding 255 and a secondary winding 260 such as windings 405 and 420 (FIG. 4). An output signal $V_{i2}(t)$ coupled through the coupling transformer 215 may be amplified by an amplifier 270 resulting in an output of an amplified signal $V_{o3}(t)$. A final output signal $V_{o4}(t)$ may be obtained from a comparator 280. As shown in FIG. 3, $V_{o4}(t)$ may have the same timing as the input signal $V_{i1}(t)$, except that $V_{o4}(t)$ may be completely isolated from the driver circuit 205.

An implementation of coupling system 200 is shown in FIG. 2B. The input signal $V_{i1}(t)$ may be input to a buffer circuit 220 which may include resistors R1 and R2 and a comparator 222. The buffer circuit 220 may work as a comparator and be operable to transform noise and distorted waveforms into clean waveforms which have consistent slew rates and magnitudes such as signal $V_1(t)$ shown in FIG. 3. A threshold voltage of comparator 222 may be set to $V_R$ and a hysteresis voltage may be set by V1max*R2/(R1+R2) to a proper value, where V1max is the maximum voltage swing of $V_1(t)$. The differentiator 230 may be implemented by a resistor $R_3$ and a capacitor $C_1$. The output of the differentiator 230 may be $V_2(t)$. The output bias voltage of $V_2(t)$ may be set to $V_R$. Comparators 240 and 250 may include comparator 245 and resistors R4 and R5, and comparator 252 and resistors R6 and R7 respectively. Resistors R4 and R5, and R6 and R7 may set hysteresis values for comparators 245 and 252 respectively to ensure reliable and stable triggering.

Since the two threshold voltages, $V_{R1}$ and $V_{R2}$ of comparators 245 and 252 may be set around a center voltage of $V_R$, narrow pulses with consistent pulse widths may be achieved by the circuit shown in FIG. 2B. The output voltages from comparators 245 and 252, $V_{o1}(t)$ and $V_{o2}(t)$ respectively, drive the PCB track coupler primary winding 255, generating the input voltage $V_{i2}(t)$ at the receiver circuit 210. This voltage is further amplified by the amplifier 270 resulting in a same output voltage $V_{o3}(t)$ as $V_{i2}(t)$ but with a larger amplitude as shown in FIG. 3 Voltage $V_{o3}(t)$ may be sent to trigger the comparator 280 which may have its threshold voltage set to $V_R$ and the hysteresis set by $R_{12}$ and $R_{13}$. It can be seen that the output voltage, $V_{o4}(t)$, from comparator 280 may be the same as the original input voltage of the driver circuit $V_{i1}(t)$. In this manner, transmitting the input voltage $V_{i1}(t)$ with high voltage isolation is achieved.

In contrast to conventional ways for transmitting a pulse signal, the coupling system 100 of the present invention has the following advantages. The coupling transformer 110 only needs to transmit narrow pulses, such as $V_{o1}(t)$, $V_{o2}(t)$ and $V_{i2}(t)$ as opposed to transmitting the original waveform $V_{i1}(t)$ directly. Transmitting the narrow pulses can be done by using much smaller transformers, saving cost and increasing the timing accuracy. Since only narrow pulses need to be transmitted, a PCB track coupler such as coupling transformer 400 can be utilized, which can be made with high reliability and consistency and is free. As further described herein, an ET value may be reduced when the coupling system 100 of the present invention is utilized.

Figure 6:
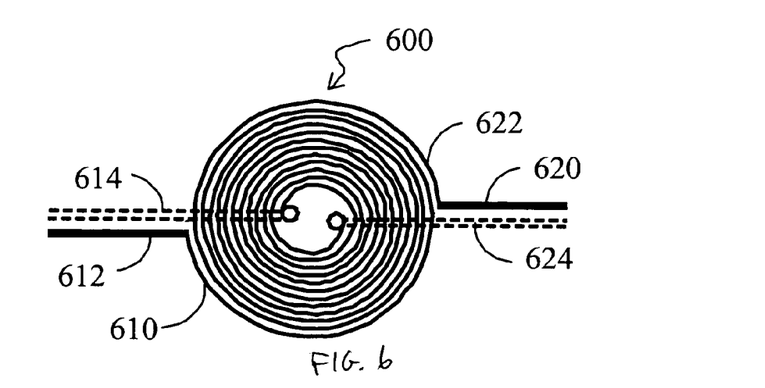
FIG. 6 shows a multiple turn multiple layer PCB trace coupler which can be used for the system shown in FIG. 5 in accordance with the present invention.

With reference to FIG. 6, a multiple turn coupling transformer generally designated 600 is shown. A primary winding 610 may include a first lead 612 disposed on one side of a PCB and a second lead 614 disposed on another side of the PCB. A secondary winding 622 may include a first lead 620 disposed on the one side of the PCB and a second lead 624 disposed on the another side of the PCB. This embodiment of coupling transformer 110 results in higher self inductance of each winding 610 and 622.

Figure 5:
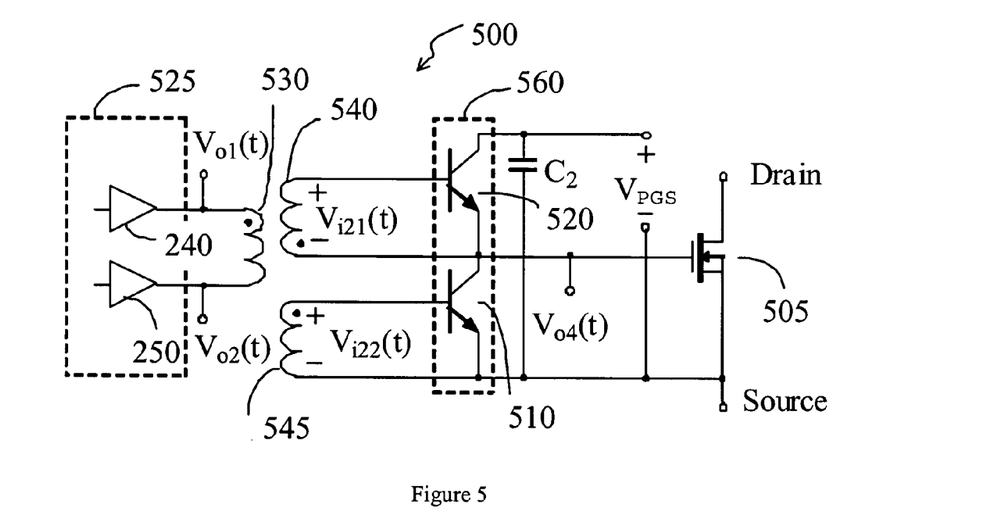
FIG. 5 shows a low cost and simple embodiment of the PCB trace coupling system for the receiver side in accordance with the present invention.
Figure 7:
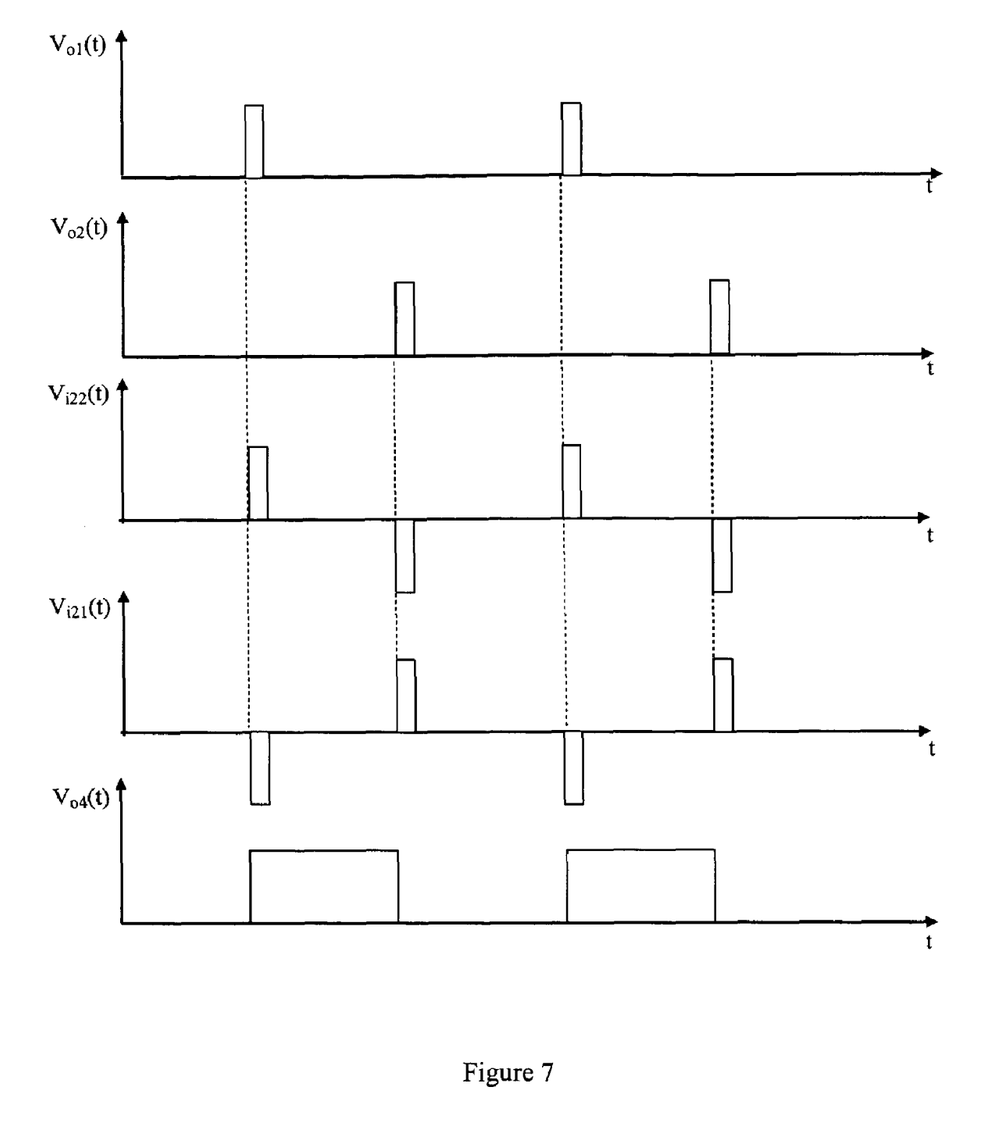
FIG. 7 shows the waveform of the system shown in FIG. 5 in accordance with the present invention.

A typical application of the printed circuit board trace coupling system 100 of the invention is for driving a MOSFET. A circuit generally designated 500 for driving a MOSFET is shown in FIG. 5 and the waveforms for circuit 500 are shown in FIG. 7, where an N-channel MOSFET 505 is driven. In practice utilizing components such as comparators 240 and 250 (FIG. 2) may not be cost effective. In an aspect of the invention, two NPN transistors 510 and 520 may be used as the amplifier 270 and the comparator 280 in the circuit 200 of FIG. 2. Circuit 500 may include a driver circuit 525, shown with most of the same components omitted for simplicity, except for comparators 240 and 250. Output voltages $V_{o1}(t)$ and $V_{o2}(t)$ are the same as in circuit 200. A primary winding 530 may be coupled to secondary windings 540 and 545. The output voltages of the secondary windings may be $V_{i21}(t)$ and $V_{i22}(t)$ respectively. A capacitor C2 may be a reservoir capacitor for a power supply VPGS. N-channel MOSFET 505 may be driven by an output voltage $V_{o4}(t)$. A drain and a source of MOSFET 505 may be connected to other circuit components (not shown) for which the MOSFET 505 serves as an electronic power switching component. In circuit 500, block 560 may be operable to perform the functions of amplifier 270 and comparator 280 as well as drive MOSFET 505.

Figure 8:
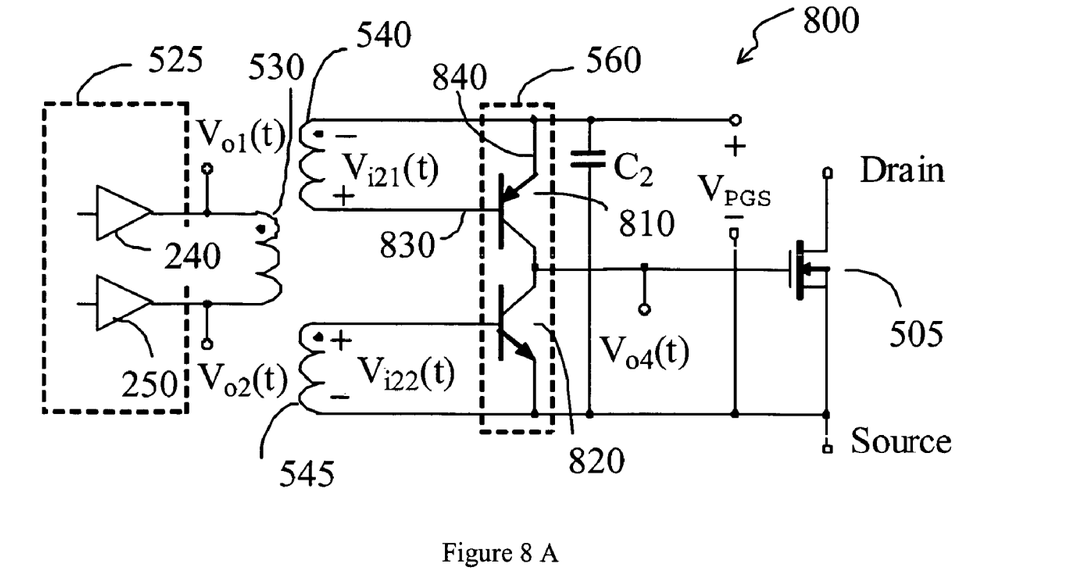
FIG. 8A shows an alternative embodiment of the system shown in FIG. 5 in accordance with the present invention.
FIG. 8B shows an alternative embodiment of the system shown in FIG. 5 in accordance with the present invention.

With reference to FIG. 8A, in another aspect of the invention, a circuit generally designated 800 may include PNP transistor 810 and NPN transistor 820 coupled in a common collector configuration in place of NPN transistors 510 and 520. Secondary windings 540 and 545 may be connected between a base 830 and an emitter 840 with the polarity as shown.

In another aspect of the invention and with reference to FIG. 8B, a circuit generally designated 805 may include NPN transistor 820 and PNP transistor 810 coupled in a common emitter configuration as shown. Secondary windings 540 and 545 may be connected with the polarity as shown.

Figure 9:
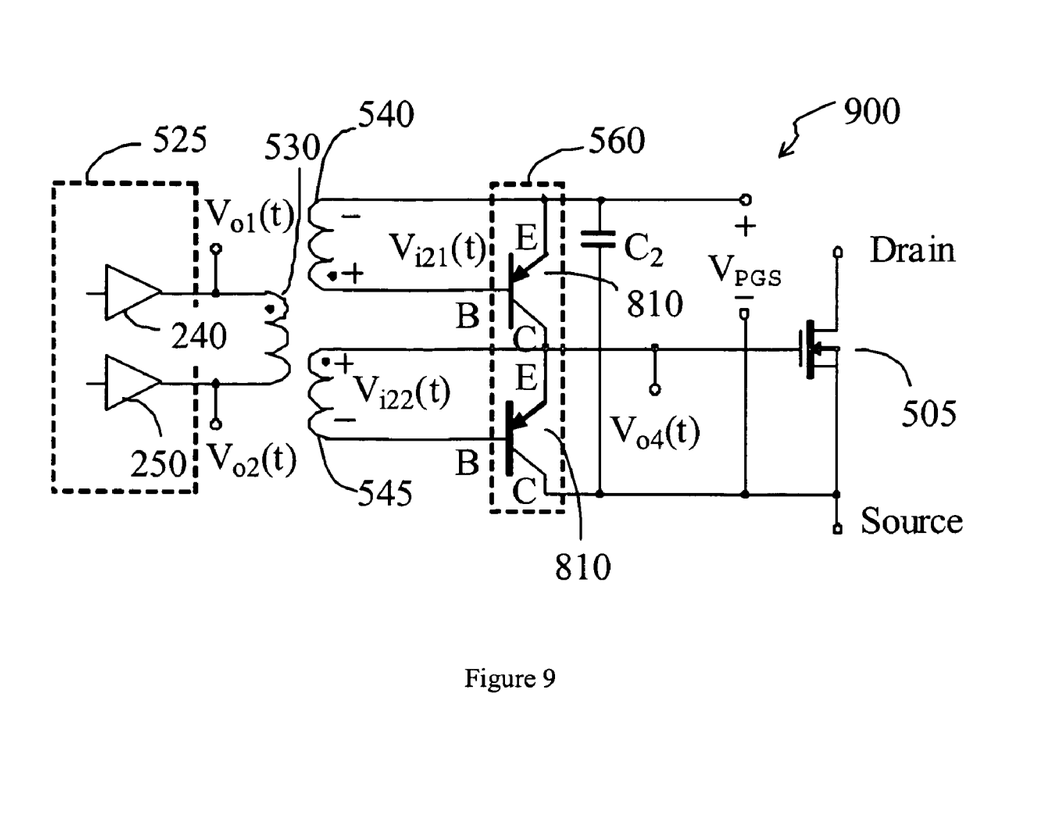
FIG. 9 shows another alternative embodiment of the system shown in FIG. 5 in accordance with the present invention.

In yet another aspect of the invention and with reference to FIG. 9, a circuit generally designated 900 may include PNP transistors 810 coupled in a collector-emitter configuration as shown. Secondary windings 540 and 545 may be connected with the polarity as shown.

Figure 10:
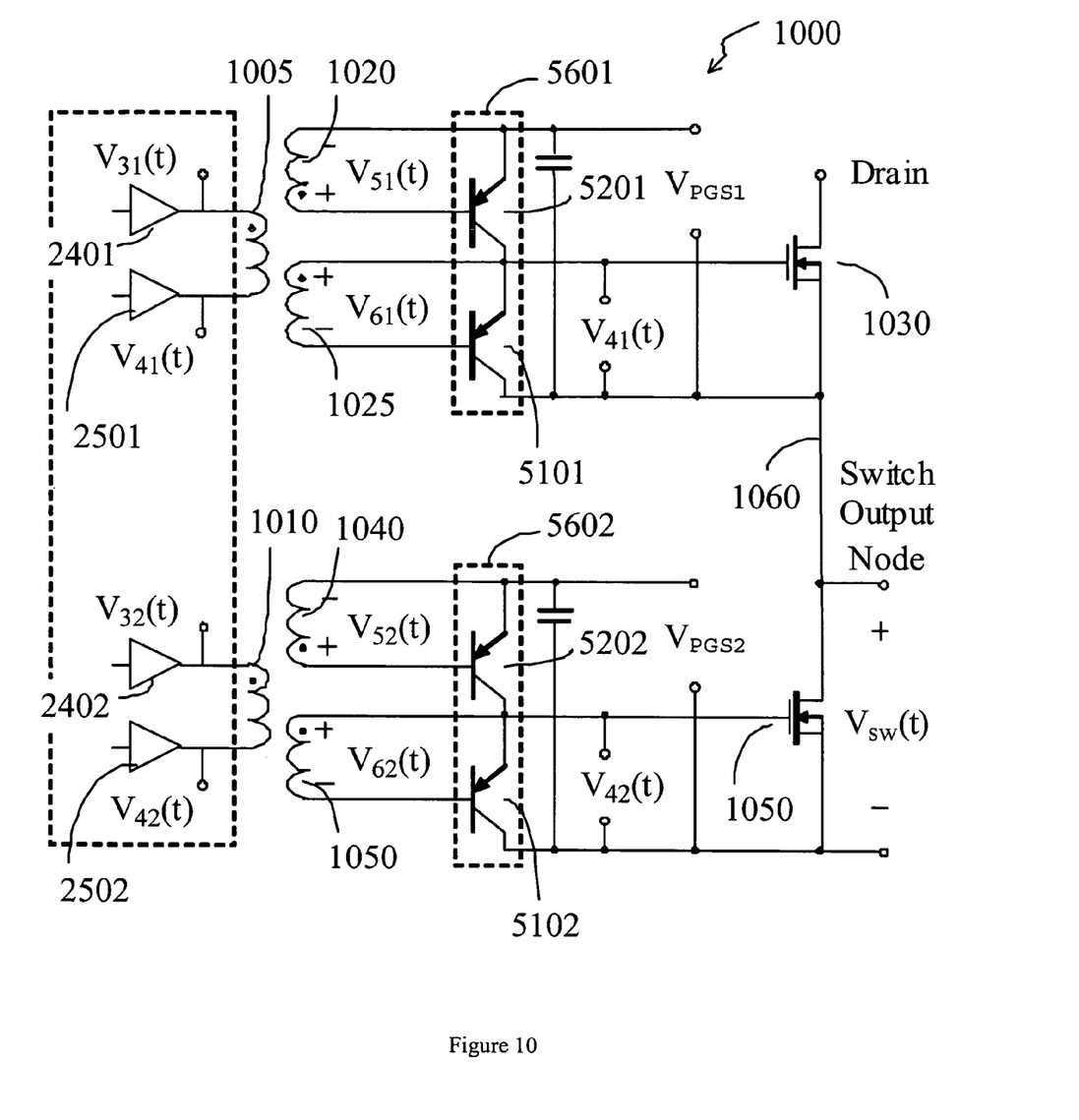
FIG. 10 shows a complete system when the PCB trace coupling system is being employed for driving a pair of high power N-channel MOSFETs in accordance with the present invention.
Figure 11:
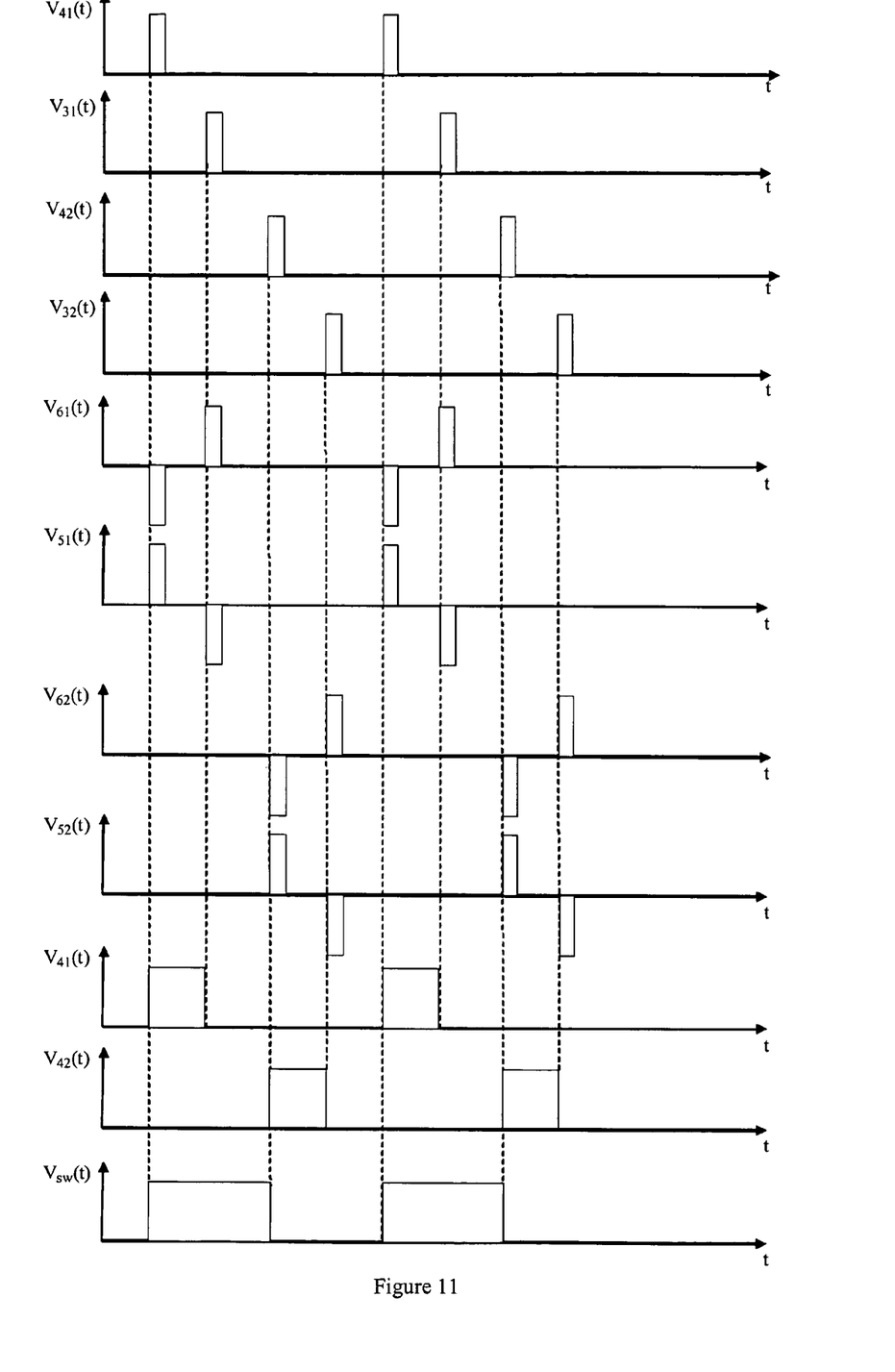
FIG. 11 shows the waveform of the system shown in FIG. 10 in accordance with the present invention.

With reference to FIG. 10, a circuit generally designated 1000 for driving a pair of high power N-channel MOSFETs may include a pair of primary windings 1005 and 1010. Primary winding 1005 may be coupled to secondary windings 1020 and 1025 for driving MOSFET 1030. Primary winding 1010 may be coupled to secondary windings 1040 and 1045 for driving MOSFET 1050. In this manner a switched output node 1060 may be provided. Waveforms for circuit 1000 are shown in FIG. 11.

Circuits 800, 805, 900 and 1000 provide narrow pulses to MOSFETs 505, 1030 and 1050 as opposed to conventional ways of using transformers for driving MOSFETs. For a pulse transformer, when the pulse voltage to be transmitted is the same, the narrower the pulse width, the smaller the size of the transformer. Circuits 800, 805, 900 and 1000 advantageously transmit low power signals as opposed to circuits known in the prior art. In general, the lower the power the transformer needs to transmitted, the smaller the size of the transformer. Furthermore, circuits 800, 805, 900 and 1000 provide high isolation voltage easily. This is due to the fact that the isolation voltage for the coupling transformer 110 is proportional to a minimum gap between the PCB tracks for the primary and secondary windings. Increasing the gap can easily be done when laying out the PCB tracks without increasing the cost, except that the PCB tracks will occupy a larger area. In contrast, when using a conventional transformer, the isolation voltage is proportional to the thickness of the isolation material. Increasing the isolation voltage by increasing the material thickness will increase the cost of the transformer proportionally. Finally, the P CB track transformer 100 of the present invention is obtained almost for free, while conventional are costly. Almost all electronic circuits are built on PCBs. Providing the PCB track transformer 100 only requires a small PCB area without external components. Conventional transformers are made of iron or ferrite cores with copper wire windings and are expensive, bulky, and not as reliable as the PCB track transformer 100 of the present invention.

In use, the pulses transmitted by the coupling transformer 110 can have a pulse width as narrow as 50 ns. Prior art designs require a pulse width between 10 uS to 100 uS when driving MOSFETs with PWM signals. The pulse width reduction achieved by the system of the present invention is as high as 2000 times. In addition, the voltage magnitude provided by the system of the present invention is 0.24V, much less than conventional designs which require the transformer to 15V provide signals for driving the gates of the MOSFETs. The ET value required for the coupling transformer 110 is reduced by 15V/0.24V*2000=125,000. For a transformer, the smaller the ET value, the smaller the size volume. Therefore the coupling transformer 110 provided by the system of the present invention may be 125,000 times smaller in size volume than that required by a conventional circuit.

Differentiator 230 takes the derivative of $V_{11}(t)$ and results in $V_{12}(t)$. The signal pulse transmitted by the coupling transformer 110 has a width as narrow as 30 ns (nanosecond) to 100 ns, while the width of pulses transmitted by a transformer in the conventional system can be as wide as 100 us (microsecond) when a PWM (Pulse Width Modulation) switching frequency is 10 KHz (kilo Hertz). For a transformer, the longer the width of the pulses transmitted, the larger the size of the transformer. In addition to the advantage of only transmitting narrow pulses, the system of the present invention requires the secondary voltage to be around 0.7V to 1V, while prior art circuits require the voltage to be around 5V to 20V. Thus the ET value, an important parameter of a pulse transform, for the coupling transformer 110 may be only 1 V*100 ns=100 nsV and for a prior art transformer can be as high as 100 us*20V=2000 usV, about 2000 times larger than that of the system of the present invention. For a pulse transformer, the larger the ET value the larger the size of the transformer. Therefore, the coupling transformer 110 of the present invention can be 2000 times smaller than the transformer needed by a conventional circuit. Therefore, the printed circuit board trace coupling system 100, which has small ET values, can be used in the various embodiments of the present invention.

While particular embodiments of the invention have been shown and described, numerous variations and alternate embodiments will occur to those skilled in the art. Accordingly, it is intended that the invention be limited only in terms of the appended claims.

I claim:

1. A printed circuit board trace coupling system for providing high voltage isolation comprising:
    a driving circuit;
    a coupling transformer including a printed circuit board trace, the printed circuit board trace comprising a closed loop primary winding surrounding a closed loop secondary winding formed on a same surface of the printed circuit board, the closed loop secondary winding being coupled to leads formed on another side of the printed circuit board; and
    a receiving circuit.

2. The printed circuit board trace coupling system as claimed in claim 1, wherein the driving circuit comprises a differentiator coupled between an input buffer and a pair of comparators.

3. The printed circuit board trace coupling system as claimed in claim 2, wherein the primary winding is coupled to the output of the comparators.

4. The printed circuit board trace coupling system as claimed in claim 3, wherein the secondary winding is coupled to the receiving circuit.

5. The printed circuit board trace coupling system as claimed in claim 4, wherein the receiving circuit comprises an amplifier coupled to the secondary winding and a comparator coupled to the amplifier.

6. The printed circuit board trace coupling system as claimed in claim 1, wherein the coupling transformer comprises a single primary winding and a single secondary winding.

7. The printed circuit board trace coupling system as claimed in claim 1, wherein the coupling transformer comprises multiple primary windings and multiple secondary windings.

* * * * *